(12) United States Patent
Chen et al.

(10) Patent No.: US 6,717,474 B2
(45) Date of Patent: Apr. 6, 2004

(54) HIGH-SPEED DIFFERENTIAL TO SINGLE-ENDED CONVERTER

(75) Inventors: Yi-Huei Chen, Hsinchu (TW); Po-Chiun Huang, Hsinchu (TW)

(73) Assignee: Integrated Programmable Communications, Inc., Palo Alto, CA (US)

( * ) Notice: Subject to any disclaimer, the term of this patent is extended or adjusted under 35 U.S.C. 154(b) by 0 days.

(21) Appl. No.: 10/115,179

(22) Filed: Apr. 2, 2002

(65) Prior Publication Data

US 2003/0141935 A1 Jul. 31, 2003

Related U.S. Application Data

(60) Provisional application No. 60/352,400, filed on Jan. 28, 2002.

(51) Int. Cl.[7] ................................................ H03F 3/45
(52) U.S. Cl. ........................ 330/301; 330/253; 330/257
(58) Field of Search ................................ 330/253, 255, 330/257, 301

(56) References Cited

U.S. PATENT DOCUMENTS

| | | | | |
|---|---|---|---|---|
| 5,153,529 A | * | 10/1992 | Koda et al. | 330/257 |
| 5,285,168 A | * | 2/1994 | Tomatsu et al. | 330/253 |
| 5,703,532 A | * | 12/1997 | Shin et al. | 330/253 |
| 6,356,152 B1 | * | 3/2002 | Jezdic et al. | 330/253 |
| 6,483,382 B1 | * | 11/2002 | Gerstenhaber et al. | 330/257 |

* cited by examiner

*Primary Examiner*—Khanh V. Nguyen
(74) *Attorney, Agent, or Firm*—Fish Richardson P.C.

(57) ABSTRACT

A differential to single-ended converter, which is composed of a transconductance amplifier, a current mirror and buffer circuit and a transimpedance stage, is disclosed. A differential voltage signal is provided to the inputs of the transconductance amplifier and converted to a differential current signal. The current mirror and buffer circuit serves as a differential to single-ended current conveyer and isolates the transconductance stage and the following transimpedance stage. Finally, the single-ended current signal is provided to the input of the transimpedance stage and converted to a single-ended current signal.

7 Claims, 4 Drawing Sheets

HIGH-SPEED DIFFERENTIAL TO SINGLE-ENDED CONVERTER

CROSS-REFERENCE TO RELATED APPLICATIONS

This application claims the priority of U.S. Provisional Application Ser. No. 60/352,400 filed Jan. 28, 2002, entitled "CMOS DIFFERENTIAL TO SINGLE-ENDED COVERTER."

BACKGROUND OF THE INVENTION

1. Field of the Invention

The present invention is related to an electronic circuit, more specifically, to a CMOS/Bipolar/BiCMOS differential to single-ended converter for converting a differential signal to a single-ended signal without the use of operational amplifiers.

2. Description of the Prior Art

Differential type signals, each of which includes one data signal and its inverse, are usually applied in various analog integrated circuits. The differential signals can compensate for environmental noise and interference because the data signal and its inverse are equally affected by the same noise and interference, which is usually called the common mode noise. However, the utilization of the differential signals is not suited to the integrated circuit applications with low pin count. Single-ended signals are preferred to reduce the number of pins in the integrated circuits. Accordingly, a kind of converters for converting a differential signal (two signals) to a single-ended signal, which is usually called a differential to single-ended converter, has been widely developed for facilitating various applications. In addition, the differential to single-ended converter can serve as an output buffer to isolate internal circuitry from output pads or a data buffer to isolate the previous stage from the following stage that requires single-ended input signals.

The conventional differential to single-ended converter is usually implemented by an operational amplifier. FIG. 1 (Prior Art) illustrates a circuit diagram of a conventional differential to single-ended converter. As shown in FIG. 1, the converter includes an operational amplifier 10, resistors R11 and R21 coupled to the inverting input terminal of the operational amplifier 10 and resistors R12 and R22 coupled to the non-inverting input terminal of the operational amplifier 10. The data signal of the differential is coupled to the inverting input terminal of the operational amplifier 10 through resistor R11 and its inverse is coupled to the non-inverting input terminal of the operational amplifier 10 through resistor R12. The single-ended output signal Vout is sent from the output terminal of the operational amplifier 10 coupled to resistor R21.

However, the conventional differential to single-ended converter is not suitable to the integrated circuit application since the embedded operational amplifier usually wastes a lot of chip area and suffers from speed limited.

U.S. Pat. No. 5,432,476 disclosed a differential to single-ended converter without the use of the operational amplifier. FIG. 2 (Prior Art) is a block diagram of the conventional differential to single-ended converter disclosed in the '473 patent. As shown in FIG. 2, a differential input signal Vin is provided to an input buffer 22. Input buffer 22 provides the data signal and its inverse of the differential signal Vin to V/I converters 24 and 26, respectively. Thus, the output of the V/I converter 24 is provided to a mirror device 28. In addition, a DC level setter 30 establishes a DC voltage level and provides it to a resistive device 32. Finally, the outputs of the mirror device 28, the resistive device 32 and the V/I converter 26 are combined to generate the single-ended output signal Vout. The disclosed differential to single-ended converter is implemented without the use of the operational amplifier, but too many resistors are used for the function implementation.

SUMMARY OF THE INVENTION

Therefore, the objective of the present invention is to provide a novel differential to single-ended converter for converting a differential signal to a single-ended signal without the use of the operational amplifier.

The present invention achieves the above-indicated objects by providing a differential to single-ended converter, which is composed of a transconductance amplifier, a current mirror and buffer circuit and a transimpedance amplifier. A differential voltage signal is provided to the inputs of the transconductance stage and converted to a differential current signal. The current mirror and buffer circuit serves as a differential to single-ended current conveyer and isolates the transconductance stage and the following transimpedance stage. Finally, the single-ended current signal is provided to the input of the transimpedance stage and converted to a single-ended voltage signal.

The transconductance stage of the present invention is preferably a source-degenerated amplifier with a degeneration resistor. In addition, the transimpedance stage of the present invention is preferably a shunt feedback amplifier with a shunt feedback resistor. The overall gain of the differential to single-ended converter of the present invention is determined by the ratio of the degeneration resistor value and the shunt feedback resistor value, which facilitates the circuitry design since ratios of resistance values of two resistors can be easily controlled in the semiconductor manufacture process.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 1:
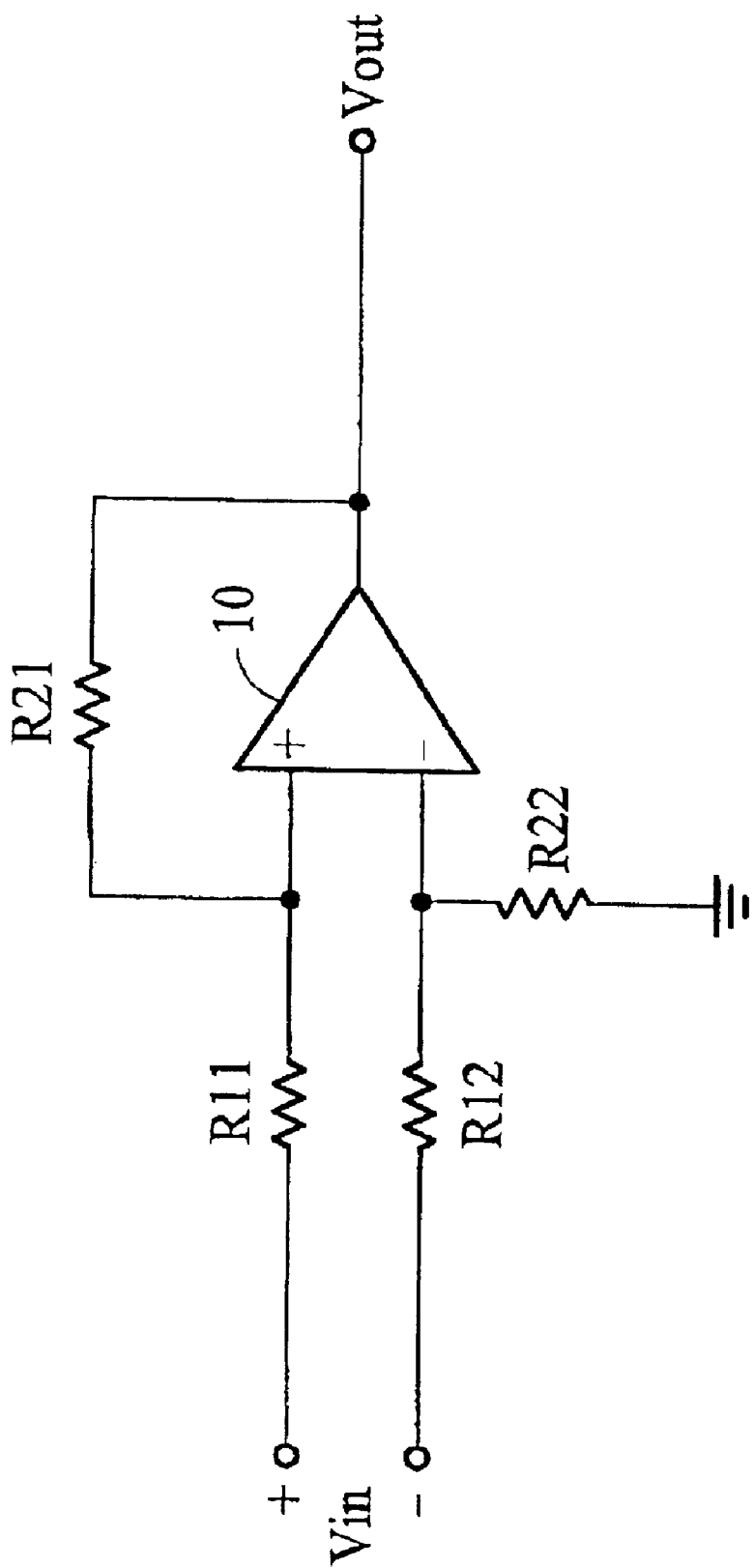
FIG. 1 (Prior Art) illustrates a circuit diagram of a conventional differential to single-ended converter using an operational amplifier.
Figure 2:
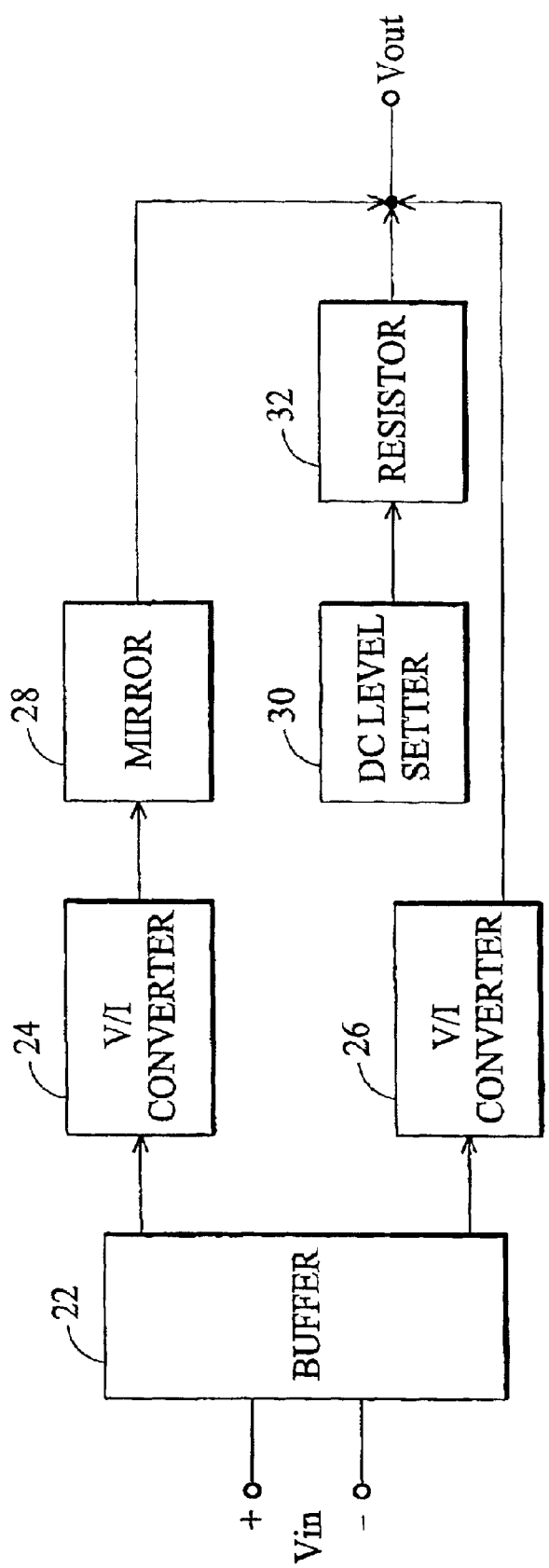
FIG. 2 (Prior Art) is a block diagram of a conventional differential to single-ended converter without the use of an operational amplifier.
Figure 3:
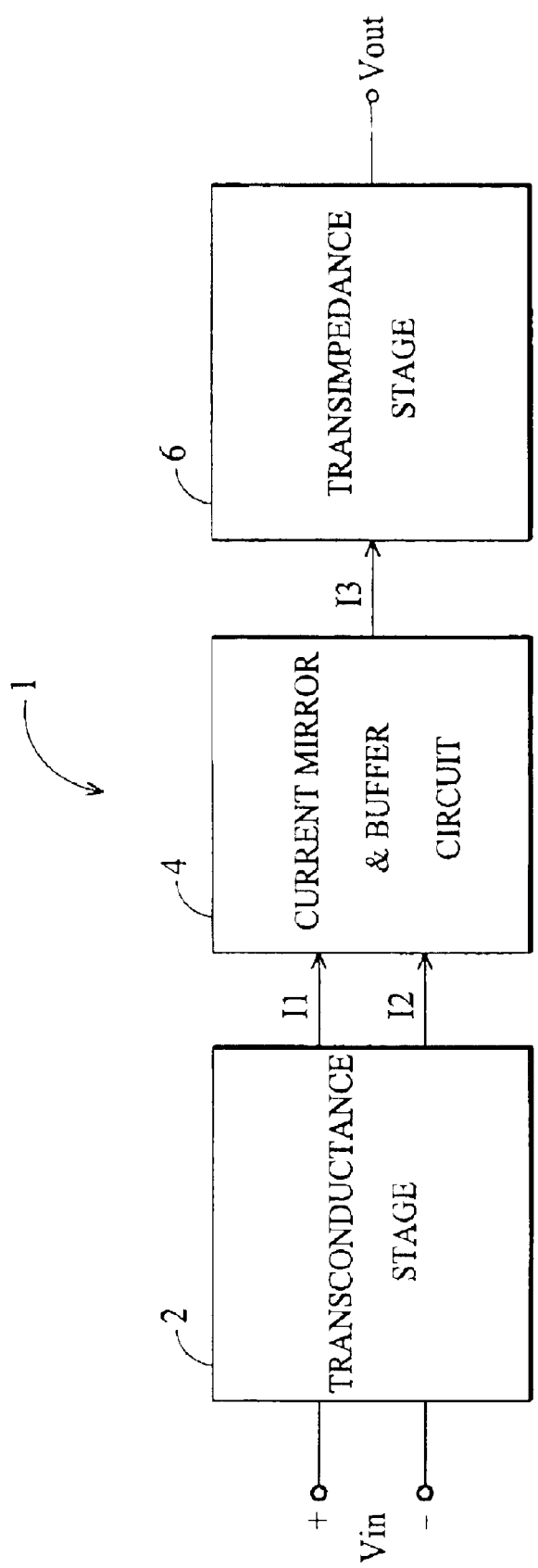
FIG. 3 is a block diagram of the differential to single-ended converter according to the preferred embodiment of the present invention.

FIG. 3 is a block diagram of the differential to single-ended converter 1 according to the preferred embodiment of the present invention. As shown in FIG. 3, the differential to single-ended converter 1 includes a transconductance stage 2, a current mirror and buffer circuit 4 and a transimpedance stage 6. A differential voltage signal Vin is provided to the transconductance stage 2, which is used to convert the differential voltage signal Vin to a corresponding differential current signal (I1, I2). The differential current signal (I1, I2) is then provided to the inputs of the current mirror and buffer circuit 4, which serves as a differential to single-ended current conveyer and can be used to isolate the transconductance stage 2 and the transimpedance stage 6. A single-ended current signal I3 is provided by the current mirror and buffer circuit 4 and sent to the transimpedance stage 6, which converts the single-ended current signal I3 to a single-ended output signal Vout.

The conversion methodology of the present invention is to convert a differential voltage signal to a corresponding differential current signal, and to a single-ended current signal by a current mirror and buffer circuit, and to a single-ended voltage signal. The folded current mirror structure is used to implement the middle stage 4 for conveying a differential current signal to a single-ended current signal and isolating the stage 2 and stage 6.

Figure 4:
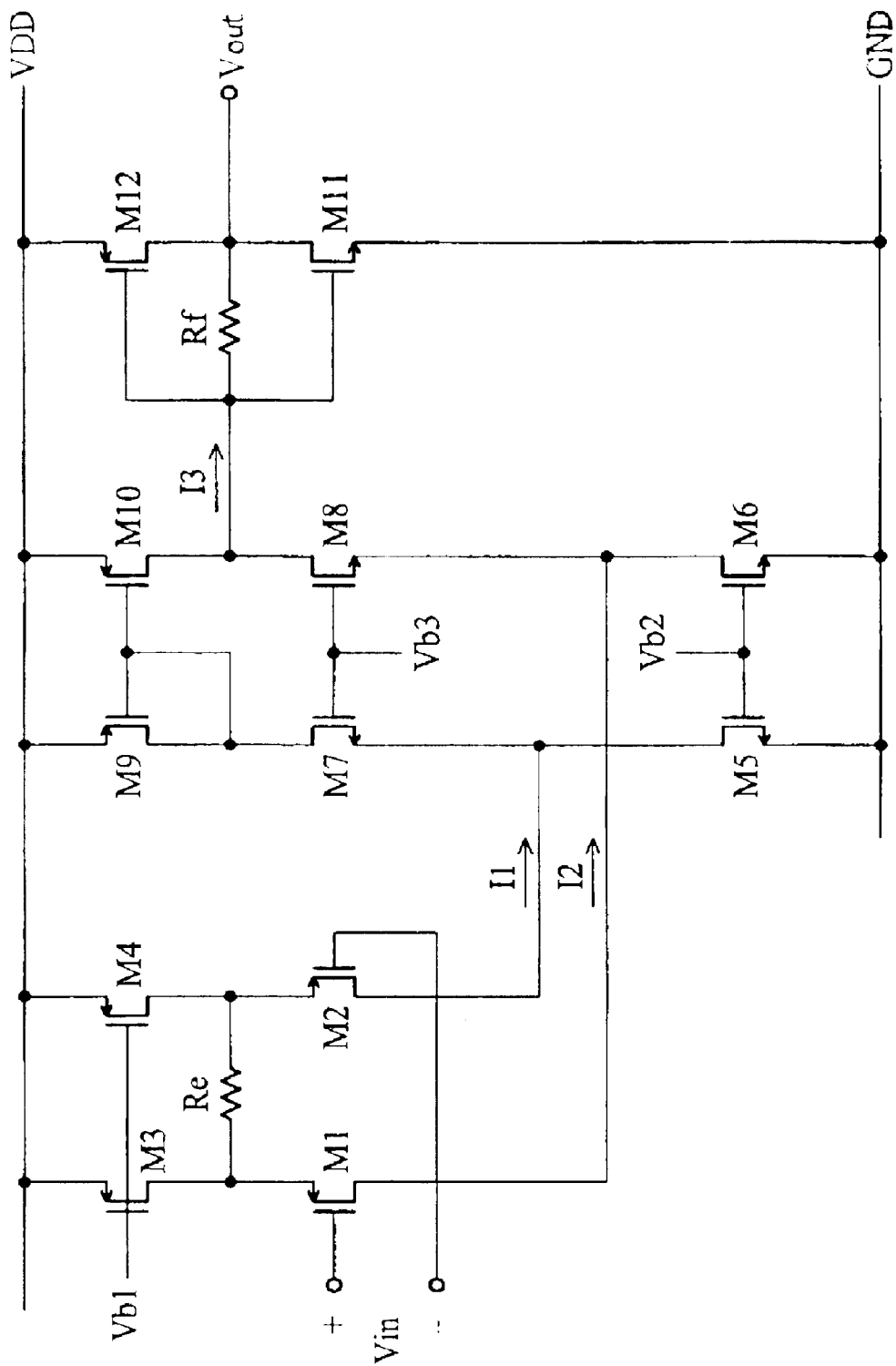
FIG. 4 is a circuit diagram of the differential to single-ended converter according to the preferred embodiment of the present invention.

FIG. 4 is a circuit diagram of an example of the differential to single-ended converter according to the preferred embodiment of the present invention. It is understood by those skilled in the art that the differential to single-ended converter of the present invention also can be implemented by various transconductance amplifiers, current mirror and buffer circuits and transimpedance amplifiers. As shown in FIG. 4, the differential to single-ended converter includes PMOS transistors M1, M2, M3, M4, M9, M10 and M12, NMOS transistors M5, M6, M7, M8 and M11, a resistor Re and a resistor Rf. The constitution and operation of the differential to single-ended converter shown in FIG. 4 will be described as follows in view of FIG. 3.

PMOS transistors M1, M2, M3 and M4 and resistor Re constitute a transconductance amplifier with degeneration, which corresponds to the transconductance stage 2 shown in FIG. 3. The gates of PMOS transistors M1 and M2 receive the differential voltage signal Vin. The sources of PMOS transistors M1 and M2 are coupled to the drains of PMOS transistors M3 and M4. The sources and gates of PMOS transistors M3 and M4 are coupled to a supply VDD and a bias voltage Vb1, respectively. In addition, resistor Re serves as a degeneration source resistor of PMOS transistors M1 and M2 and is coupled between the sources of PMOS transistors M1 and M2. A differential current signal (I1, I2) is provided by the drains of PMOS transistors M1 and M2. Thus, the transconductance $g_m$ of the transconductance stage 2, which is determined by the resistance of resistor Re, can be expressed by:

$$g_m = \frac{g_{m1,m2}}{1 + g_{m1,m2}R_E} \quad (1)$$

where $g_{m1,m2}$ denotes the transconductance value of transistors M1 and M2, and $R_E$ denotes the resistance value of the degeneration resistor Re.

NMOS transistors M5, M6, M7 and M8 and PMOS transistors M9 and M10 constitute the current mirror and buffer circuit 4 shown in FIG. 3. The gates of NMOS transistors M5 and M6 are connected and biased by a bias voltage Vb2. The drains and sources of NMOS transistors M5 and M6 are coupled to the drains of PMOS transistors M1 and M2 and the ground GND, respectively. In addition, the gates of NMOS transistors M7 and M5 are connected and biased by a bias voltage Vb3 and the sources of NMOS transistors M7 and M8 are also coupled to the drains of PMOS transistors M1 and M2. The drains of NMOS transistors M7 and M5 are coupled to the drains of PMOS transistors M9 and M10, respectively. PMOS transistors M9 and M10 serve as a current mirror and their sources are coupled to the supply VDD. As shown in FIG. 4, currents I1 and I2, which represent the differential current signal, are fed to the contact of NMOS transistors M5 and M7 and the contact of NMOS transistors M6 and M5, respectively. In addition, a current I3, which represents the single-ended current signal, is transmitted from the contact of NMOS transistor M5 and PMOS transistor M10 to the following stage. The folded structure utilized in the embodiment of the current mirror and buffer circuit 4 can increase the voltage swing and isolate two adjacent stages. As described above, the function of the current mirror and buffer circuit is to convey a differential current signal (I1, I2) to a single-ended current signal 13.

NMOS transistor M11, PMOS transistor M12 and a resistor Rf constitute a shunt feedback amplifier, which corresponds to the transimpedance stage 6 shown in FIG. 3. The gates of NMOS transistor M11 and PMOS transistor M12 are connected and thus coupled to the contact of drains of NMOS transistor M8 and PMOS transistor M10. The drains of NMOS transistor M11 and PMOS transistor M12 are also connected. The sources of NMOS transistor M11 and PMOS transistor M12 are coupled to the ground GND and the supply VDD, respectively. Resistor Rf is a shunt feedback resistor, which is coupled between the gates and the drains of NMOS transistor M11 and PMOS transistor M12. The single-ended voltage signal Vout is outputted from the contact of the drains of NMOS transistor M11 and PMOS transistor M12. The transimpedance value $R_{zi}$ of the transimpedance stage 6, which is determined by the resistance value of the shunt feedback resistor Rf, can be expressed by:

$$R_{zi} = R_F \frac{g_{m11+m12}R_F}{1 + g_{m11+m12}R_F} \quad (2)$$

where $g_{m11+m12}$ denotes the sum of the transconductance values of the transistors M11 and M12, and $R_F$ denotes the resistance value of the degeneration resistor Rf.

According to equations (1) and (2), the overall voltage gain $A_V$ of the differential to single-ended converter can be derived as:

$$\begin{aligned} A_V &= g_m R_{zi} \\ &= \frac{g_{m1,m2}}{1 + g_{m1,m2}R_E} \cdot R_F \cdot \frac{g_{m11+m12}R_F}{1 + g_{m11+m12}R_F} \\ &\cong \frac{R_F}{R_E} \end{aligned} \quad (3)$$

The approximation in equation (3) can be obtained if $g_{m1,m2}R_E \gg 1$ and $g_{m11+m12}R_F \gg 1$. Large values of $g_{m1,m2}$ and $g_{m11+m12}$ can be obtained by selecting proper bias currents. Thus, the condition of the approximation can be satisfied. In the differential to single-ended converter of the present invention, the overall voltage gain is determined by the ratio of the resistance values of resistors Re and Rf. Thus, no large resistance value of resistors is required to obtain an accurate ratio voltage gain, which can save layout area in the implementation of the integrated circuits. In addition, the accuracy of the voltage gain can be maintained even if larger process variations exist.

To maintain the input signal performance, the linearity is important of the differential to single-ended converter. In the preferred embodiment of the present invention, the concepts of degeneration and shunt feedback are adopted to achieve good linearity, As described above, the output swing can be controlled with the ratio of the degeneration resistor Re and the shunt feedback resistor Rf. These two resistors can be implemented by passive or active devices for a variety of applications.

Finally, in the differential to single-ended converter of the embodiment, the input common mode voltage is irrelevant to the level of the single-ended output signal since the current mirror and buffer circuit isolates the input and output stages. Basically, the output signal is almost controlled by MOS transistors M11 and M12 and the shunt feedback resistor Rf no matter what the change of the input common mode voltage is.

While the invention has been described by way of example and in terms of the preferred embodiment, it is to be understood that the invention is not limited to the disclosed embodiments. On the contrary, it is intended to cover various modifications and similar arrangements as would be apparent to those-skilled in the art. For example, the current mirror and buffer circuit can be separated into a current mirror circuit and a current buffer circuit and the components of the differential to single-ended converter can be integrated or separated. Therefore, the scope of the appended claims should be accorded the broadest interpretation so as to encompass all such modifications and similar arrangements.

What is claimed is:

1. A differential, to single-ended converter comprising:

a transconductance amplifier for receiving a differential voltage signal and converting the differential voltage signal to a differential current signal, wherein the transconductance amplifier has a degeneration resistor;

a current mirror and buffer circuit, coupled to the transconductance amplifier, for conveying the differential current signal to a single-ended current signal; and a transimpedance amplifier, coupled to the current mirror and buffer circuit, for receiving the single-ended current signal and converting the single-ended current signal to a single-ended voltage signal, wherein the transimpedance amplifier has a shunt feedback resistor;

wherein the current mirror and buffer circuit provides isolation between the transconductance amplifier and the transimpedance amplifier, and an overall gain of the differential to single-ended converter is determined by a ratio of resistance values of the degeneration resistor and the shunt feedback resistor.

2. The differential to single-ended converter an recited in claim 1, wherein the current mirror and buffer circuit comprises:

first and second MOS transistors having gates receiving a bias voltage, having sources coupled to a second supply node, and having drains receiving the differential current signal;

third and fourth MOS transistors having gates receiving the bias voltage and having sources coupled to the drains of the first and second MOS transistors, respectively;

a fifth MOS transistor having a drain and a gate coupled to a drain of the third MOS transistor and having a source coupled to a first supply node; and a sixth MOS transistor having a gate coupled to the drain of the third MOS transistor, having a source coupled to the first supply node and having a drain coupled to a drain of the fourth MOS transistor and providing the single-ended current signal.

3. A differential to single-ended converter comprising:

a transconductance amplifier for receiving a differential voltage signal and converting the differential voltage signal to a differential current signal, the transconductance amplifier having first and second MOS transistors for receiving the differential voltage signal at their gates and providing the differential voltage signal at their drains, a degeneration resistor coupled between sources of the first and second MOS transistor, and third and fourth MOS transistors having drains coupled to the sources of the first and second transistors, having sources coupled to a first supply node and having gates receiving a bias voltage;

a current mirror and buffer circuit, coupled to the transconductance amplifier, for conveying the differential current signal to a single-ended current signal; and a transimpedance amplifier, coupled to the current mirror and buffer circuit, for receiving the single-ended current signal and converting the single-ended current signal to a single-ended voltage signal;

wherein the current mirror and buffer circuit provides isolation between the transconductance amplifier and the transimpedance amplifier.

4. A differential to single-ended converter comprising:

a transconductance amplifier for receiving a differential voltage signal and converting the differential voltage signal to a differential current signal;

a current mirror and buffer circuit, coupled to the transconductance amplifier, for conveying the differential current signal to a single-ended current signal; and a transimpedance amplifier, coupled to the current mirror and buffer circuit, for receiving the single-ended current signal and converting the single-ended current signal to a single-ended voltage signal, the transimpedance having a first MOS transistor having a gate receiving the single-ended current signal and having a source coupled to a second supply node;

a second MOS transistor having a gate coupled to the gate of the first MOS transistor, having a source coupled to a first supply node, and having a drain coupled to a drain of the first MOS transistor for providing the single-ended voltage signal; and a shunt feedback resistor coupled between the gates and the drains of the first and second MOS transistors.

5. A differential to single-ended converter, comprising:

first and second supply nodes;

first and second MOS transistors having gates receiving a differential input signal;

a degeneration resistor coupled between sources of the first and second MOS transistors;

third and fourth MOS transistors having drains coupled to the sources of the first and second transistors, having sources coupled to the first supply node and having gates receiving a bias voltage;

fifth and sixth MOS transistors having gates receiving the bias voltage, having sources coupled to the second supply node, and having drains coupled to drains of the first and second MOS transistors, respectively;

seventh and eight MOS transistors having gates receiving the bias voltage and having sources coupled to the drains of the first and second MOS transistors, respectively;

ninth and tenth MOS transistors having drains coupled to drains of the seventh and eighth MOS transistors, respectively, having gates coupled to the drain of the ninth MOS transistor and having sources coupled to the first supply node;

an eleventh MOS transistor having a gate coupled to the drain of the tenth MOS transistor and having a source coupled to the second supply node;

a twelfth MOS transistor having a gate coupled to the drain of the tenth MOS transistor, having a source coupled to the first supply node, and having a drain coupled to a drain of the eleventh MOS transistor, and a shunt feedback resistor coupled between the gates and the drains of the eleventh and twelfth MOS transistors;

wherein a single-ended output signal is provided by the connected drains of the eleventh and twelfth MOS transistors.

6. The differential to single-ended converter as recited in claim 5, wherein the first and second MOS transistors, the third and fourth MOS transistors, the ninth and tenth MOS transistors and the twelfth MOS transistor are PMOS transistors; and the fifth and sixth MOS transistors, the seventh and eighth MOS transistors and the eleventh MOS transistor are NMOS transistors.

7. The differential to single-ended converter as recited in claim 6, an overall gain of the differential to single-ended converter is determined by a ratio of resistance values of the degeneration resistor and the shunt feedback resistor.

* * * * *